(12) United States Patent
Li

(10) Patent No.: US 6,928,027 B2
(45) Date of Patent: Aug. 9, 2005

(54) VIRTUAL DUAL-PORT SYNCHRONOUS RAM ARCHITECTURE

(75) Inventor: Tao Li, San Diego, CA (US)

(73) Assignee: Qualcomm Inc, San Diego, CA (US)

( * ) Notice: Subject to any disclaimer, the term of this patent is extended or adjusted under 35 U.S.C. 154(b) by 27 days.

(21) Appl. No.: 10/686,960

(22) Filed: Oct. 15, 2003

(65) Prior Publication Data

US 2004/0202040 A1 Oct. 14, 2004

Related U.S. Application Data

(60) Provisional application No. 60/462,653, filed on Apr. 11, 2003.

(51) Int. Cl.$^7$ ................................................. G11C 11/00
(52) U.S. Cl. ............. 365/233; 365/189.08; 365/189.02; 365/189.03; 711/147; 711/149; 711/150; 711/151; 711/158; 711/168; 711/169; 327/144; 327/152; 326/93
(58) Field of Search ....................... 365/189.08, 189.02, 365/189.03, 233; 711/147, 149, 150, 151, 168, 169; 327/144, 152; 326/93

(56) References Cited

U.S. PATENT DOCUMENTS

| | | | |
|---|---|---|---|
| 3,715,729 A | | 2/1973 | Mercy |
| 4,594,657 A | | 6/1986 | Byrns |
| 4,692,886 A | * | 9/1987 | Miki et al. .................. 708/272 |
| 5,274,678 A | * | 12/1993 | Ferolito et al. ............. 375/357 |
| 5,335,931 A | * | 8/1994 | Lacroix et al. ............. 280/602 |
| 5,414,703 A | * | 5/1995 | Sakaue et al. ......... 370/395.71 |
| 5,511,209 A | * | 4/1996 | Mensch, Jr. ................ 713/500 |
| 5,592,434 A | * | 1/1997 | Iwamoto et al. ............ 365/233 |
| 5,614,847 A | * | 3/1997 | Kawahara et al. ............ 326/98 |
| 5,941,990 A | * | 8/1999 | Hiiragizawa ................ 713/310 |
| 5,996,043 A | * | 11/1999 | Manning .................... 711/105 |
| 6,002,882 A | * | 12/1999 | Garde ......................... 712/35 |
| 6,262,939 B1 | * | 7/2001 | Matsui ........................ 365/233 |
| 6,349,391 B1 | * | 2/2002 | Petivan et al. ................ 714/11 |
| 6,415,390 B1 | * | 7/2002 | Manning .................... 713/501 |
| 6,470,439 B2 | * | 10/2002 | Yamada et al. ............. 711/215 |
| 6,496,940 B1 | * | 12/2002 | Horst et al. .................... 714/4 |
| 6,570,419 B2 | * | 5/2003 | Hanzawa et al. ........... 327/152 |
| 6,650,637 B1 | * | 11/2003 | Bansal et al. ............... 370/360 |
| 6,652,536 B2 | * | 11/2003 | Mathews et al. ........... 606/113 |
| 6,724,686 B2 | * | 4/2004 | Ooishi et al. ............... 365/233 |
| 6,772,278 B2 | * | 8/2004 | Toda .......................... 711/105 |
| 6,814,295 B2 | * | 11/2004 | Posch et al. ................ 235/492 |
| 2002/0135408 A1 | * | 9/2002 | Chiu .......................... 327/145 |

FOREIGN PATENT DOCUMENTS

JP          406012313 A  *  1/1994  ........... G06F/12/00

OTHER PUBLICATIONS

Oliver Aberth: A Multiple Computer Linkage: IEEE Transactions on Computers, vol. 18, No. 12 (1969).

* cited by examiner

Primary Examiner—Viet Q. Nguyen
(74) Attorney, Agent, or Firm—Philip R. Wadsworth; Charles D Brown; Kenyon Jenckes

(57) ABSTRACT

Disclosed is a virtual dual-port synchronous RAM device, system, and method, wherein the design requires minimal hardware cost compared with a dual-port RAM architecture or the traditional architecture used with a single-port RAM. Disclosed is a read/write memory device including means to accept signals from a first host and a second host, the first host having a first clock and the second host having a second clock, the signals including a first clock signal and a second clock, a clock switching means for switching between the first clock signal and the second clock signal, a single-port random access memory (RAM) module for storing data, and a RAM clock for synchronizing the clock signals with the RAM module.

19 Claims, 4 Drawing Sheets

VIRTUAL DUAL-PORT SYNCHRONOUS RAM ARCHITECTURE

RELATED APPLICATIONS

This application claims priority to U.S. Provisional Application Ser. No. 60/462,653, entitled "A Virtual Dual-Port Synchronous RAM Architecture," filed Apr. 11, 2003.

BACKGROUND OF THE DISCLOSURE

1. Field of the Disclosure

The present disclosure relates generally to memory devices and, more particularly, to single-port memory devices.

2. Background of the Disclosure

The need to read and write simultaneously to a computer memory device is satisfied by dual-port memory devices; however, dual-port memory devices are relatively expensive compared to single-port memory devices. A single-port memory device, such as a static random access memory (SRAM) or a dynamic random access memory (DRAM), can either read or write during any specific time period, typically during a single clock cycle, but cannot read or write during a specific time period at the same time.

Other memory devices incorporate a single-port SRAM that utilizes separate read and write cycles from a clock. Other memory devices utilize a circuit with a dual port first-in and first-out (FIFO) memory stack, wherein the circuit includes a first and second bank and single-port RAMs to its data are written in alternation and, wherein each bank when not being written to is read from.

Other memory devices include a single-port memory which is used to store an image which can be read from and simultaneously written to. Separate read and write buffers communicate to an arbiter section, which in turn communicates with the single board memory.

Other memory devices simultaneously read and write data into a single-port RAM, wherein new data is stored in a corresponding new data address in a buffer, and a comparison is made of the new data address with a current read address. In the event that the read and write addresses are the same, the new data is stored at a modified address.

When two hosts from different clock regimes (i.e., clocks are asynchronous) want to access the same synchronous RAM, presently there are two architectures that may be utilized. The first architecture may utilize a dual-port synchronous RAM. Control logic needed for a dual-port synchronous RAM may be relatively simple, but the disadvantage of this architecture is that the dual-port synchronous RAM is bigger and more expensive than a single-port synchronous RAM. In addition, some manufacturers may not support a dual-port synchronous RAM in the end product.

Another architecture may utilize a single-port synchronous RAM wherein the single-port synchronous RAM is connected to a clock port to one host's clock. The other host's signals need to be synchronous to the first host's clock; then the synchronous control/data signals from both hosts would pass through an arbitration block, which decides which host would have the right to access the RAM. The problem of this architecture and method is that the clock connecting to the RAM would always be required to be on. Otherwise, if the first host's clock is turned off, the other host could not access the RAM. The other shortcoming of this architecture and method is the delay that would be introduced and the extra hardware that would be required by the synchronization and arbitration requirements.

What is needed is a system and method to accommodate asynchronous hosts that want to access the same RAM at the same time.

SUMMARY

Disclosed is a read/write memory device including means to accept signals from a first host and a second host, the first host having a first clock and the second host having a second clock, the signals including a first clock signal and a second clock, a clock switching means for switching between the first clock signal and the second clock signal, a single-port random access memory (RAM) module for storing data, and a RAM clock for synchronizing the clock signals with the RAM module.

Also disclosed is a read/write memory system including a first host and a second host, the first host having a first clock generating a first clock signal and the second host having a second clock generating a second clock signal, a clock switching means for switching between the first clock signal and the second clock signal, a single-port random access memory (RAM) module for storing data, and a RAM clock for synchronizing the clock signals with the RAM module. The read/write memory system disclosed is not, however, limited to two hosts. The architecture disclosed herein may support multiple hosts, each with their respective clocks and the system having means to control access of one host at a time to the RAM.

Further yet, disclosed is a method for storing data in a memory device and for recalling the stored data therefrom including providing a first host and a second host, the first host having a first clock generating a first clock signal and the second host having a second clock generating a second clock signal, switching between the first clock signal and the second clock signal, allowing either the first host or the second host access to a single-port random access memory (RAM) module, and storing data to and recalling the stored data from the RAM module.

BRIEF DESCRIPTION OF THE DRAWINGS

The disclosure will now be described in greater detail with reference to example embodiments illustrated in the accompanying drawings, in which like elements bear like reference numerals, and wherein.

DETAILED DESCRIPTION

Figure 1:
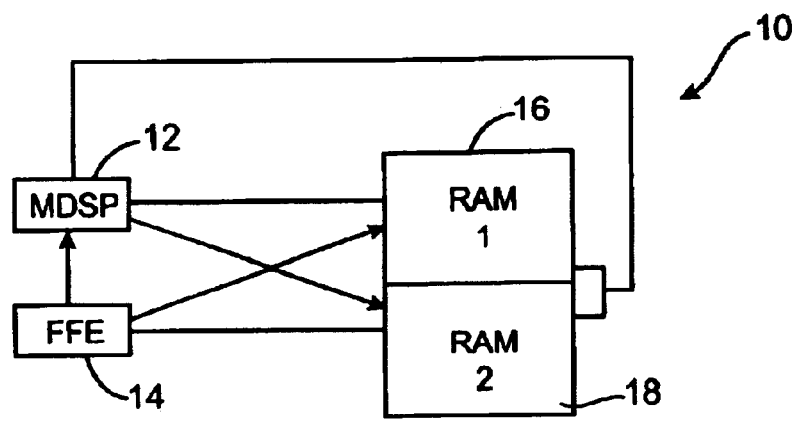
FIG. 1 is a block diagram of an exemplary block diagram of a dual-port synchronous RAM architecture of the prior art.

Shown in FIG. 1 is a dual-port synchronous RAM device of the prior art. In this design, two hosts access two random access memory (RAM) modules, however, a dual-port synchronous RAM is larger and more expensive than a single-port synchronous RAM device. As shown in FIG. 1, the dual-port synchronous RAM device 10 includes a modem digital signal processor (MDSP) 12 and is in communication with a finger front end (FFE) 13 component. The MDSP 12 and the FFE 14 represent two hosts that access a first RAM 16 and a second RAM 18.

Figure 2:
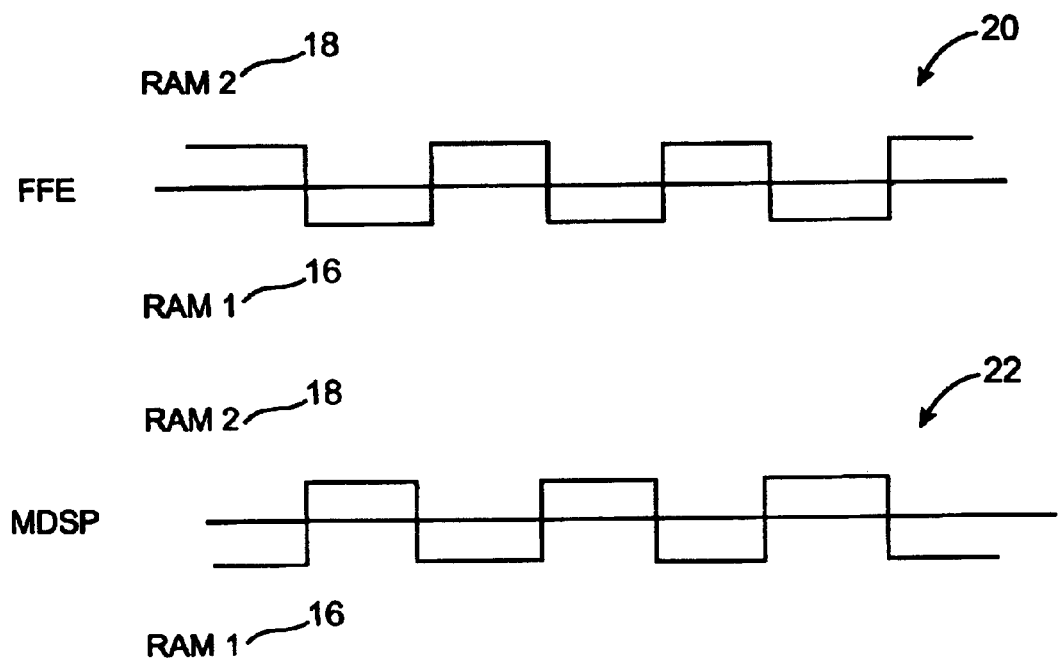
FIG. 2 is a timing diagram illustrating the synchronization of a finger-front end (FFE) and a modem digital signal processor (MDSP) of the prior art.

Shown in FIG. 2 is a timing diagram of the two hosts and the timing of their access to the first RAM and the second RAM. The first timing diagram 20 is for the FFE 14, wherein the diagram illustrates that the FFE is accessing the second RAM 18 and then alternatively accessing the first RAM 16. Likewise, diagram 22 illustrates the MDSP 12 accessing the second RAM 18 and alternatively the first RAM 16. As illustrated in FIG. 2, according to the prior art, the two hosts, here the FFE 14 and the MDSP 12, alternatively access the first RAM 16 and the second RAM 18. Therefore, when the FFE 14 is accessing the second RAM 18, the MDSP 12 is accessing the first RAM 16. Likewise, when the FFE 14 is accessing the first RAM 16, MDSP 12 is accessing the second RAM 18, and the two hosts alternate access to the first RAM 16 and the second RAM 18.

In contrast, according to the present disclosure, a read/write memory device 32 provides a virtual dual-port synchronous RAM architecture with a single-port synchronous RAM module. The dual-port synchronous RAM architecture disclosed herein requires minimal hardware costs compared to the prior art. In addition, the virtual dual-port synchronous RAM architecture of the present disclosure provides a more efficient architecture which conserves battery power and therefore extends battery life in those instances where the device is powered by a battery.

Figure 3:
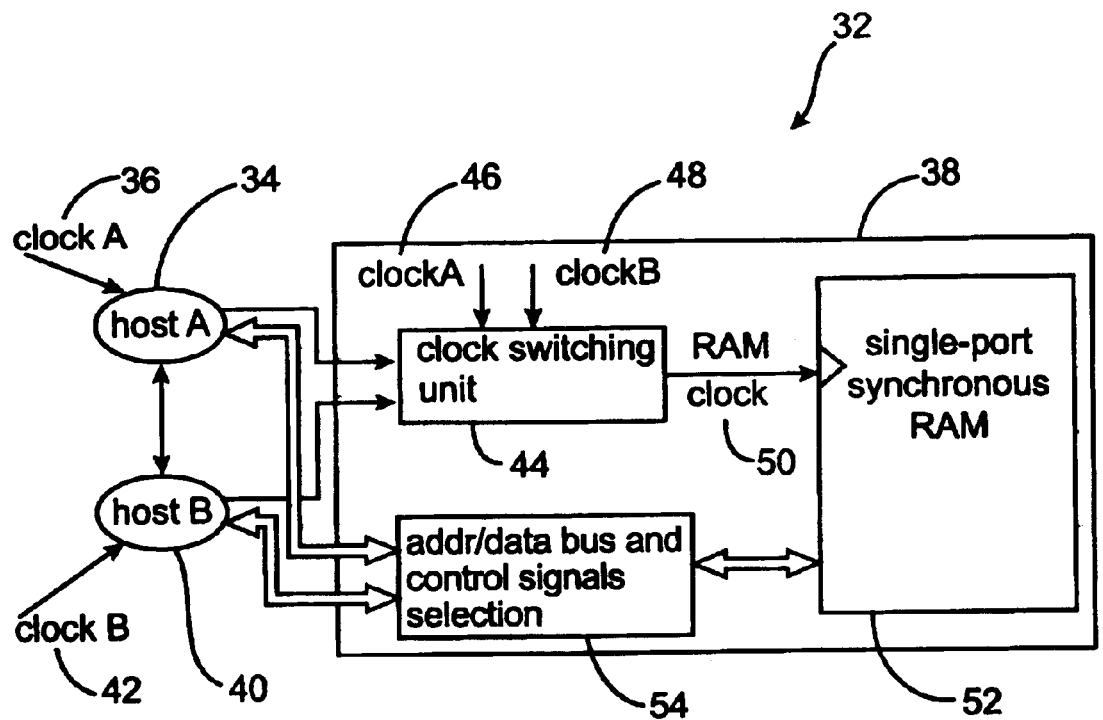
FIG. 3 illustrates a block diagram of a virtual dual-port synchronous RAM architecture of the present disclosure.
Figure 6:
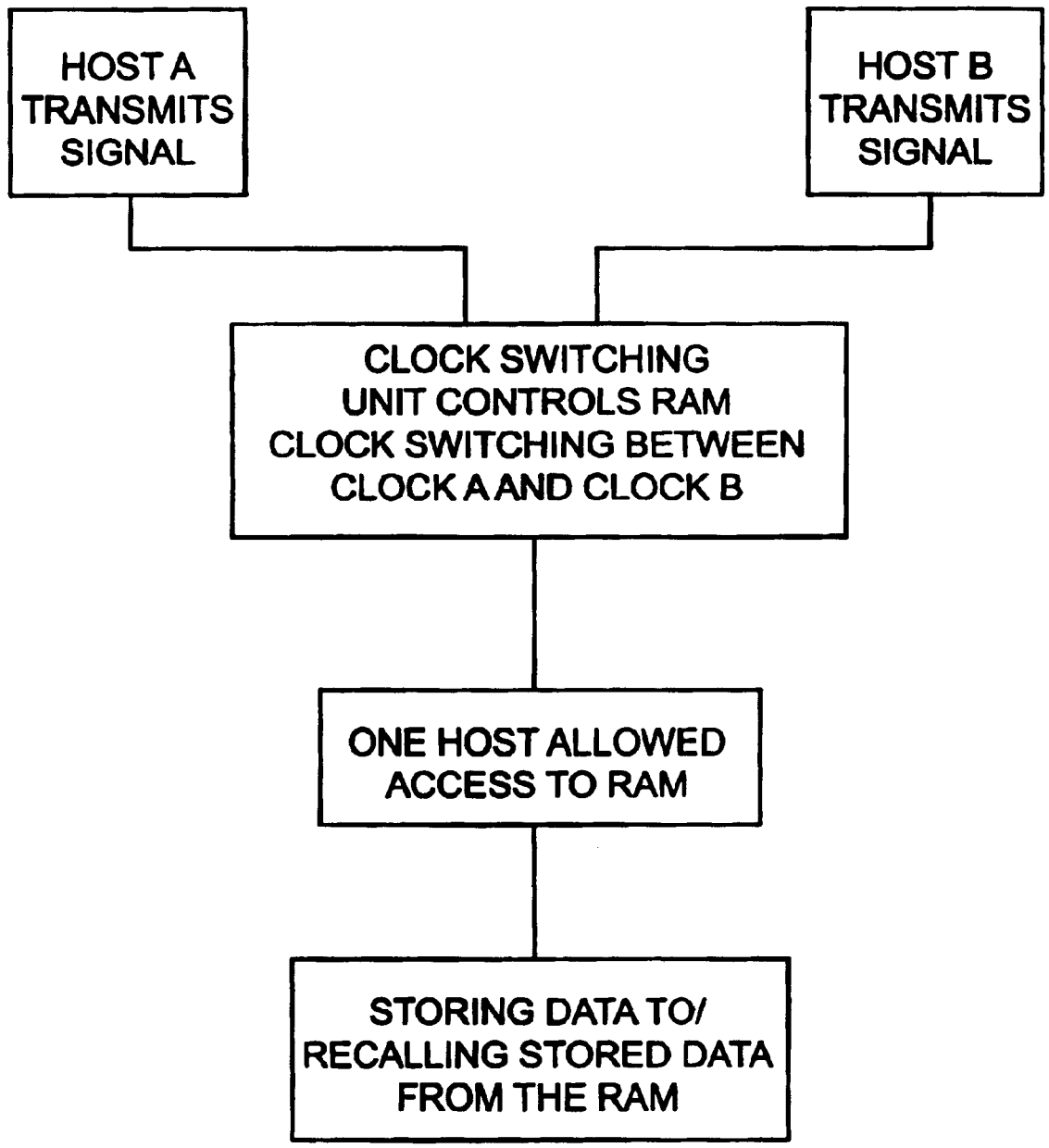
FIG. 6 illustrates a flow chart of how two hosts access a single RAM according to the present disclosure.

The virtual dual-port synchronous RAM architecture is disclosed in FIG. 3, wherein a system 32 includes a first host 34 with a first clock 36. The first host 34 is electronically connected and provides input signals to a virtual dual-port synchronous RAM device 38. A second host 40 includes a second clock 42 which also provides input signals to the virtual dual-port synchronous RAM device 38. The first host 34 and the second host 40 provide input signals to a clock switching unit 44 located internal of the virtual dual-port synchronous RAM device 38. The first host 34 provides a first clock signal 46 to the clock switching unit 44. In addition, the second host 40 provides a second clock signal 48 to the clock switching unit 44. As further described below, the clock switching unit 44 selects either the signal from the first host 34 or the signal from the second host 40. In addition, the clock switching unit 44, by selecting either the first host 34 or the second host 40, receives a first clock signal 46 with the first host 34, or a second clock signal 48 with the second host 40, and therefore the clock switching unit selects only one clock signal to a RAM clock 50 which is input to a single-port synchronous RAM module 52. Also connected to the single-port synchronous RAM module 52 is an address, data bus, and control signal selection module 54 which allows one host access to and from the single-port synchronous RAM module 52. When one host's clock is turned off, the other host can access the RAM with it's own clock, therefore, one host's clock state of being on or off does not affect the other host's read or write capability to the RAM. In addition, the read/write memory system disclosed herein is not limited to two hosts. The architecture disclosed herein may support multiple hosts, each with their respective clocks and with the system having means to control access of one host at a time to the RAM. FIG. 6 illustrates the general method of the virtual dual-port synchronous RAM architecture shown in FIG. 3.

Figure 4:
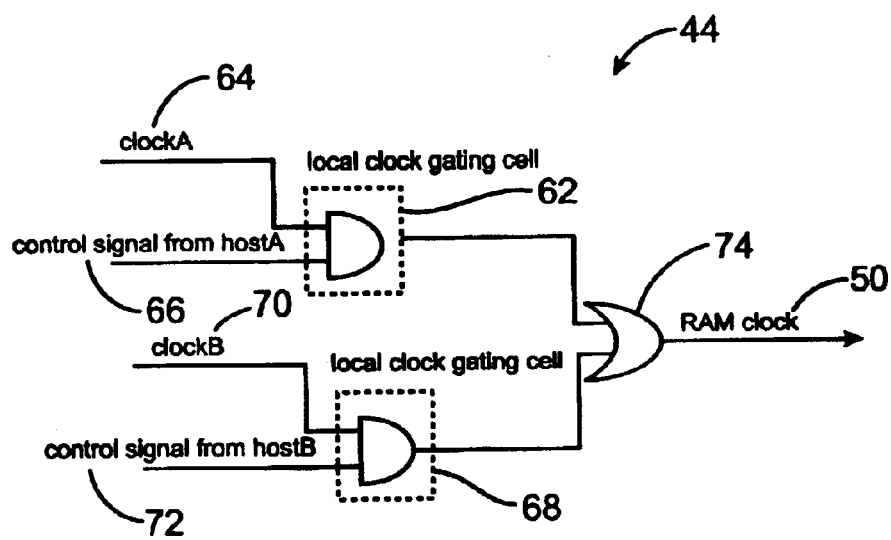
FIG. 4 is a block diagram of a clock switching unit according to the present disclosure.

FIG. 4 illustrates a clock switching unit 44 design according to the present disclosure, wherein a first local clock gating cell 62 is fed a first clock signal 64 and a control signal from the first host 66. The clock switching unit 44 also includes a second local clock gating cell 68 which is fed a second clock signal 70 and a control signal from the second host 72. The control signal from a first host 66 is synchronous to the first clock signal 64 and the control signal from the second host 72 synchronous to the second clock 70. Signals are fed respectively from the first local clock gating cell 62 and from the second local gating cell 68 to gate 74, and the output from 74 is provided to RAM clock 50. The control signal from the first host 66 and the control signal from the second host 72 will never be on at the same time as provided by the clock switching unit 44 design. In the digital domain, this means that the control signal from the first host 66 would be on, or would be a 1, while the control signal from the second host 72 would be off, or would be a 0.

Figure 5:
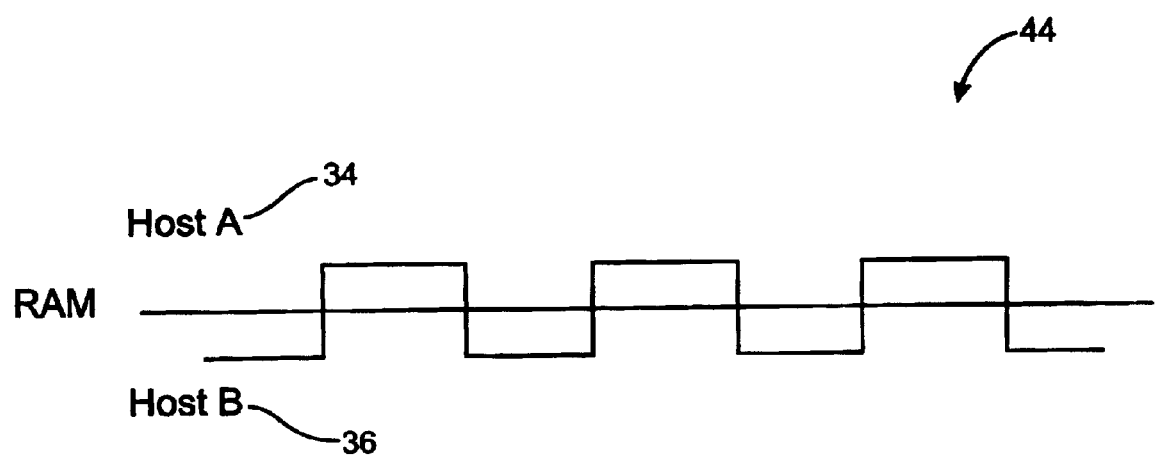
FIG. 5 illustrates a block diagram of a virtual dual-port synchronous RAM architecture of a memory device according to the present disclosure.

This is further illustrated in FIG. 5, wherein the timing diagram 44 illustrates when the single-port synchronous RAM is accessed by the first host 34 or the second host 36. As shown in FIG. 5, when the second host 36 is accessing the single-port synchronous RAM 52, then the first host 34 is not accessing the single-port synchronous RAM 52. Likewise, when the first host 34 is accessing the single-port synchronous RAM 52, then the second host 36 is not accessing the single-port synchronous RAM 52, and this cycle is repeated.

In the virtual dual-port synchronous RAM architecture disclosed herein, the communications between the first host 34 and the second host 36 guarantee that the two hosts will not access the single-port synchronous RAM 52 at the same time. The clock switching unit 44 controls the RAM clock 50 so that the RAM clock 50 switches between the first clock 36 and the second clock 42, based on the signals from the first host 34 and the second host 40. Only one host is allowed access to the single-port synchronous RAM 52 to communicate with one host's address bus, data bus, and RAM control signals. The RAM access signals selection module 54 makes its decisions based on the corresponding host's requests. The access times of the two hosts are not overlapped since only one host accesses the single-port synchronous RAM 52 at a time.

Therefore, disclosed is a virtual dual-port synchronous RAM architecture which utilizes minimum hardware and therefore has reduced costs when compared to a dual-port RAM architecture. In addition, the virtual dual-port synchronous RAM architecture disclosed herein conserves battery power and therefore extends battery life.

The previous description of the disclosure is provided to enable any person skilled in the art to make or use the present disclosure. The various modifications to these embodiments will be readily apparent to those skilled in the art, and the generic principles defined herein may be applied to other embodiments without the use of the inventive faculty. Thus, the present disclosure is not intended to be limited to the embodiments shown herein, but is to be accorded the widest scope consistent with the principles and novel features disclosed herein.

What is claimed is:

1. A read/write memory device, comprising:
   a clock switching means for switching between a first clock signal and a second clock signal;
   a single-port random access memory (RAM) module for storing data; and
   a random access memory (RAM) clock for synchronizing the clock signals with the random access memory (RAM) module.

2. The read/write memory device of claim 1, further comprising:
   means to accept signals from a first host and a second host, the signals including the first clock signal and the second clock signal.

3. The read/write memory device of claim 2, wherein the means to accept signals further comprises a first host and a second host, the first host having a first clock and the second host having a second clock, the signals including the first clock signal and the second clock signal.

4. The read/write memory device of claim 2, further comprising:
   an address and data bus component.

5. The read/write memory device of claim 2, further comprising:
   a control signal selection component for controlling the selection of the signals from the first host and the second host to the random access memory (RAM) module.

6. The read/write memory device of claim 2, wherein:
   the clock switching means further comprises a clock switching unit with a first local clock gating cell to control the first clock signal and a control signal from the first host, and a second local clock gating cell for controlling the second clock signal and a control signal from the second host.

7. The read/write memory device of claim 6, further comprising:
   a random access memory (RAM) clock for accepting the signals from the first local clock gating cell and the second local clock gating cell.

8. The read/write memory device of claim 7, wherein:
   the output of the RAM clock is fed into the single-port random access memory (RAM) module for storing data.

9. A read/write memory system, comprising:
   a first host and a second host, the first host having a first clock generating a first clock signal and the second host having a second clock generating a second clock signal;
   a clock switch for switching between the first clock signal and the second clock signal;
   a single-port random access memory (RAM) module for storing data; and
   a RAM clock for synchronizing the clock signals with the random access memory (RAM) module.

10. The read/write memory device of claim 9, further comprising:
    a control signal selection component for controlling the selection of the signals from the first host and the second host to the random access memory (RAM) module.

11. The read/write memory device of claim 9, wherein:
    the clock switching means further comprises a clock switching unit with a first local clock gating cell to control the first clock signal and a control signal from the first host, and a second local clock gating cell for controlling the second clock signal and a control signal from the second host.

12. A method for storing and recalling data in a memory device, comprising the steps of:
    generating a first clock signal and a second clock signal;
    providing a first host and the second host, wherein the first host includes a first clock that generates the first clock signal, and the second host includes a second clock generating the second clock signal;
    switching between the first clock signal and the second clock signal;
    allowing either the first clock signal or the second clock signal access to a single-port random access memory (RAM) module; and
    storing and recalling the stored data from the random access memory (RAM) module.

13. The method of claim 12, further comprising the step of:
    controlling the selection of the signals from the first host and the second host to the random access memory (RAM) module.

14. The method of claim 13, further comprising the steps of:
    controlling the first clock signal and a control signal from the first host; and
    controlling the second clock signal and a control signal from the second host.

15. The method of claim 14, wherein the first clock signal and the second clock signal are input to a random access memory (RAM) clock.

16. The method of claim 15, further comprising the step of:
    feeding the output of the random access memory (RAM) clock into the single port random access memory (RAM) module.

17. A method for storing and recalling data in a memory device, comprising the steps of:
    switching between a first clock signal and a second clock signal;
    providing a first host and the second host, wherein the first host includes a first clock that generates the first clock signal, and the second host includes a second clock generating the second clock signal;
    storing data in a single port random access memory (RAM) module; and
    synchronizing the clock signals with the random access memory (RAM) module.

18. The method of claim 17, further comprising the step of:
    controlling the selection of the signals from the first host and the second host to the random access memory (RAM) module.

19. The method of claim 18, further comprising the steps of:
    controlling the first clock signal and a control signal from the first host; and
    controlling the second clock signal and a control signal from the second host.

* * * * *